United States Patent
Ock

(10) Patent No.: US 7,978,015 B2
(45) Date of Patent: Jul. 12, 2011

(54) OSCILLATOR WITH REDUCED PHASE NOISE CHARACTERISTICS

(75) Inventor: Sungmin Ock, Austin, TX (US)

(73) Assignee: Texas Instruments Incorporated, Dallas, TX (US)

( * ) Notice: Subject to any disclaimer, the term of this patent is extended or adjusted under 35 U.S.C. 154(b) by 47 days.

(21) Appl. No.: 12/549,928

(22) Filed: Aug. 28, 2009

(65) Prior Publication Data

US 2011/0050351 A1     Mar. 3, 2011

(51) Int. Cl.
*H03B 5/12* (2006.01)
*H03L 1/00* (2006.01)
*H03L 7/099* (2006.01)

(52) U.S. Cl. .......... 331/117 R; 331/36 C; 331/117 FE; 331/175; 331/177 V

(58) Field of Classification Search ............... 331/8, 25, 331/36 C, 117 R, 117 FE, 117 D, 168, 175, 331/177 R, 177 V
See application file for complete search history.

(56) References Cited

U.S. PATENT DOCUMENTS

| | | | |
|---|---|---|---|
| 6,046,647 A * | 4/2000 | Nelson | 331/105 |
| 6,545,555 B1 * | 4/2003 | Justice et al. | 331/117 R |
| 6,842,081 B2 * | 1/2005 | Wang et al. | 331/117 R |
| 2002/0130726 A1 * | 9/2002 | Mernyei et al. | 331/117 R |
| 2008/0143446 A1 | 6/2008 | Yao et al. | |
| 2008/0150644 A1 | 6/2008 | Hosoya et al. | |

OTHER PUBLICATIONS

"A Filtering Technique to Lower LC Oscillator Phase Noise," IEEE Journal of Solid-State Circuits, vol. 36, No. 12, Dec. 2001, pp. 1921-1930 (Emad Hegazi, Henrik Sjoland, and Asad A. Abidi).

* cited by examiner

*Primary Examiner* — David Mis
(74) *Attorney, Agent, or Firm* — John J. Patti; Wade J. Brady, III; Frederick J. Telecky, Jr.

(57) ABSTRACT

One well known problem associated with voltage controlled oscillators or VCOs is phase noise, and it is desirable to reduce phase noise in order to improve VCO performance. Here, a VCO is provided where gain elements are provided that reduce phase noise. These gain elements are generally comprised of oscillator tanks.

14 Claims, 2 Drawing Sheets

OSCILLATOR WITH REDUCED PHASE NOISE CHARACTERISTICS

TECHNICAL FIELD

The invention relates generally to oscillators and, more particularly, to LC oscillators with improved phase noise characteristics.

BACKGROUND

Referring to FIG. 1 of the drawings, the reference numeral 100 generally designates a conventional voltage controlled oscillator (VCO). The VCO 100 is generally comprised of an oscillator tank, a pair of cross-coupled NMOS FETs $Q_1$ and $Q_2$ (which operate as amplifiers having transconductances of $g_m$), and a current source 102. Each of the FETs $Q_1$ and $Q_2$ has its gate coupled to the drain of the other FET Q1 and Q2, and the drain of each of the FETs Q1 and Q2 is coupled to the oscillator tank. The oscillator tank is generally comprised of inductors $L_1$ and $L_2$ (which generally have equal values) and capacitors $C_1$ and $C_2$ (which are variable capacitors).

In operation, VCO 100 is able to generate an output signal with a frequency that is generally proportional the current through current source 102 and the output resistance. The phase noise would, thus, be as follows:

$$PN = \frac{\overline{i^2} R_P^2}{2V_{OUT}^2} \left(\frac{\omega_0}{2Q_0 \Delta\omega_0}\right)^2, \quad (1)$$

where $\overline{i^2}$ is the equivalent output current noise, $Q_0$ is the loaded quality factor, $R_P$ is the output resistance, and $V_{OUT}$ is the output voltage. Specifically, for a steady state oscillation, the average transconductance ($g_m$) is approximately equal to the inverse of resistance $R_P$ ($g_m = 1/R_P$). Under these steady state conditions, equivalent output current noise $\overline{i^2}$ is as follows:

$$\overline{i^2} = \frac{4kT}{R_p} + 4kT\gamma g_m = \frac{4kT(1+\gamma)}{R_p}, \quad (2)$$

where the first term corresponds to tank resistance and the second term corresponds to the active device. By substituting Equation (2) into Equation (1), the phase noise PN can be represented as follows:

$$PN = \frac{4kT(1+\gamma)R_P}{2V_{OUT}^2}\left(\frac{\omega_0}{2Q_0\Delta\omega_0}\right)^2 = \frac{4kT(1+\gamma)R_P}{2(kI_{AVE}R_P)^2}\left(\frac{\omega_0}{2Q_0\Delta\omega_0}\right)^2. \quad (3)$$

Thus, it can be seen from this conventional VCO 100 that that improving the phase noise characteristics can be accomplished through increasing the quality factor Q of the oscillator tank or optimization of related device properties in the VCO 100.

Some examples of conventional circuits are: U.S. Patent Pre-Grant Publ. No. 2008/0143446; U.S. Patent Pre-Grant Publ. No. 2008/0150644; and Hegazi et al., "A filtering technique to lower LC oscillator phase noise," *IEEE Journal of Solid State Circuits*, Vol. 36, No. 12, December 2001.

SUMMARY

A preferred embodiment of the present invention, accordingly, provides an apparatus. The apparatus comprises a voltage source; a first node; a second node; an oscillator tank including: an inductive network that is coupled to the voltage source, the first node, and the second node; and a capacitive network that is coupled to the first node and the second node; a first transistor having a first passive electrode, a second passive electrode, and a control electrode, wherein the first passive electrode is coupled to the first node; a first gain element that is coupled between the second node and the control electrode of the first transistor; a second transistor having a first passive electrode, a second passive electrode, and a control electrode, wherein the first passive electrode is coupled to the second node; and a second gain element that is coupled between the first node and the control electrode of the second transistor.

In accordance with a preferred embodiment of the present invention, the first gain element further comprises a second oscillator tank coupled between the gate of the first transistor and the second node.

In accordance with a preferred embodiment of the present invention, the first gain element further comprises a third oscillator tank coupled between the gate of the second transistor and the first node.

In accordance with a preferred embodiment of the present invention, each of the second and third oscillator tanks further comprise: an inductor; and a first capacitor coupled in parallel to the inductor; and a second capacitor that is coupled to the inductor and the first capacitor.

In accordance with a preferred embodiment of the present invention, the inductive network further comprises: a first inductor having a first and a second terminal, wherein the first terminal of the first inductor is coupled to the first node, and wherein the second terminal of the second inductor is coupled to the voltage source; and a second inductor having a first and a second terminal, wherein the first terminal of the second inductor is coupled to the second node, and wherein the second terminal of the second inductor is coupled to the voltage source.

In accordance with a preferred embodiment of the present invention, the capacitive network further comprises: a first variable capacitor that is coupled to the first node and a third node; a second variable capacitor that is coupled to the second node and the third node, wherein a tuning voltage is applied to the third node.

In accordance with a preferred embodiment of the present invention, the first and second transistors further comprise first and second NMOS transistors.

In accordance with a preferred embodiment of the present invention, an apparatus is provided. The apparatus comprises a phase/frequency detector (PFD) that receives a reference signal; a charge pump that is coupled to the PFD; a filter that is coupled to the charge pump; a voltage controlled oscillator (VCO) that is coupled to the filter and that generates an output signal, the VCO including: a voltage source; a first node; a second node; an oscillator tank including: an inductive network that is coupled to the voltage source, the first node, and the second node; and a capacitive network that is coupled to the first node and the second node; a first transistor having a first passive electrode, a second passive electrode, and a control electrode, wherein the first passive electrode is coupled to the first node; a first gain element that is coupled between the second node and the control electrode of the first transistor; a second transistor having a first passive electrode, a second passive electrode, and a control electrode, wherein the first passive electrode is coupled to the second node; and a second gain element that is coupled between the first node and the control electrode of the second transistor; and a feedback circuit that is coupled to the VCO and to the PFD.

In accordance with a preferred embodiment of the present invention, the feedback circuit further comprises: a prescaler that is coupled to the VCO; and a divider that is coupled between the prescaler and the PFD.

In accordance with a preferred embodiment of the present invention, an apparatus is provided. The apparatus comprises a voltage source; a first node; a second node; a first oscillator tank having: a first inductor having a first and a second terminal, wherein the first terminal of the first inductor is coupled to the first node, and wherein the second terminal of the second inductor is coupled to the voltage source; and a second inductor having a first and a second terminal, wherein the first terminal of the second inductor is coupled to the second node, and wherein the second terminal of the second inductor is coupled to the voltage source; and a capacitive network that is coupled to the first node and the second node; a first NMOS transistor that is coupled to the first node at its drain; a second NMOS transistor that is coupled to the second node; a current source that is coupled to the sources of each of the first and second NMOS transistors; a second oscillator tank having: a third inductor that is coupled to the second node and to the gate of the first NMOS transistor; a first capacitor that is coupled to the second node and to the gate of the first NMOS transistors; and a second capacitor that is coupled to the coupled to the gate of the first NMOS transistor and that receives a generally constant voltage; and a third oscillator tank having: a fourth inductor that is coupled to the second node and to the gate of the second NMOS transistor; a third capacitor that is coupled to the second node and to the gate of the second NMOS transistors; and a fourth capacitor that is coupled to the coupled to the gate of the second NMOS transistor and that receives the generally constant voltage.

In accordance with a preferred embodiment of the present invention, the second and fourth capacitors are each coupled to the voltage source so as to receive the generally constant voltage.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
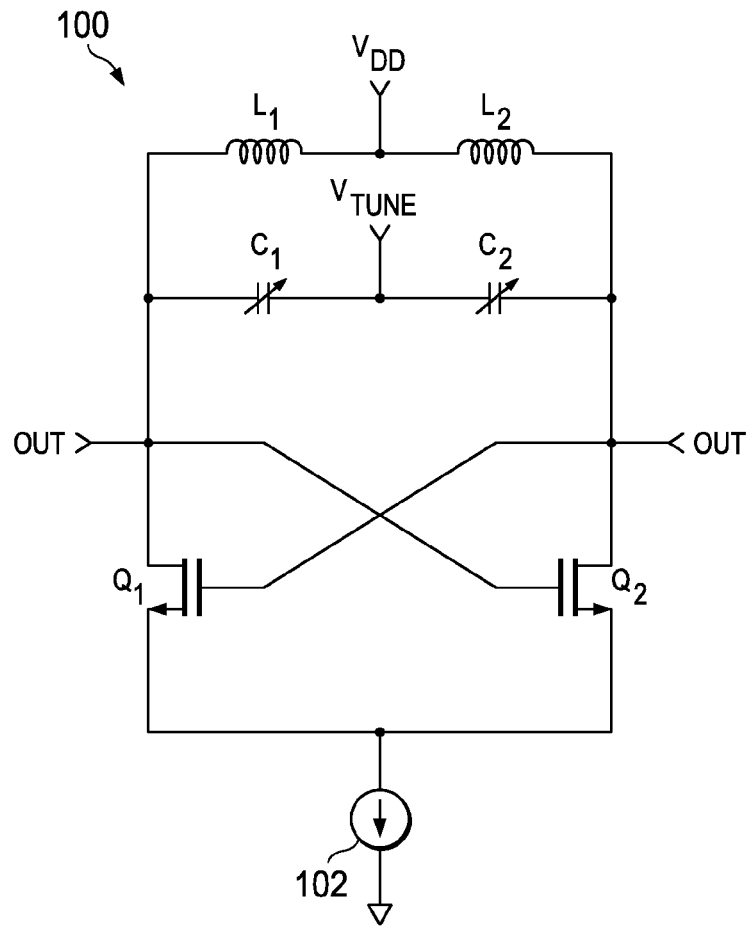
FIG. 1 is an example of a convention VCO.

Refer now to the drawings wherein depicted elements are, for the sake of clarity, not necessarily shown to scale and wherein like or similar elements are designated by the same reference numeral through the several views.

Figure 2:
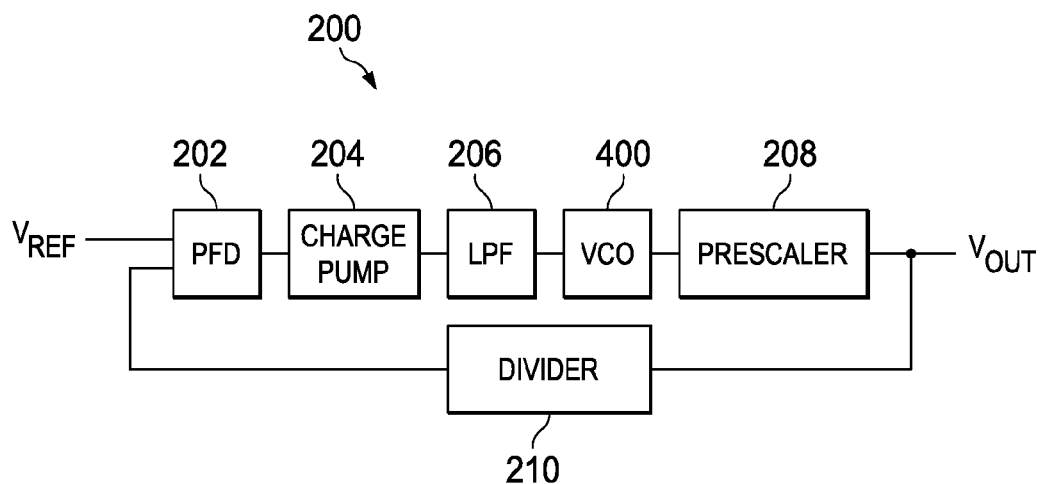
FIG. 2 is an example of circuit diagram for a phase locked loop (PLL) in accordance with a preferred embodiment of the present invention.

Referring to FIG. 2 of the drawings, the reference numeral 200 generally designates a phase lock loop (PLL) in accordance with an embodiment of the invention. The PLL 200 is generally comprised of a phase/frequency detector (PFD) 202, a charge pump 204, a low pass filter (LPF) 206, a voltage controlled oscillator (VCO) 400, a prescaler 208, and a divider 210.

This PLL 200 operates to generally create an output signal $V_{OUT}$ based on an input reference signal $V_{REF}$. The typical application for a PLL, such as PLL 200, would be for the generation of a local clock signal from a system clock signal. To accomplish this, the PFD 202 receives a feedback signal and a reference signal $V_{REF}$, and provides a signal to the charge pump 204 based on a comparison of the feedback signal and the reference signal $V_{REF}$. The output of the charge pump 204 is filtered by the LPF 204 and input into the VCO 400, where an output signal is generated that has a frequency that is proportional to the input voltage. The output signal from the VCO 400 is then prescaled to generate the output signal $V_{OUT}$, which is further divided by the divider 210 to generate the feedback signal for the PFD 202.

Figure 3:
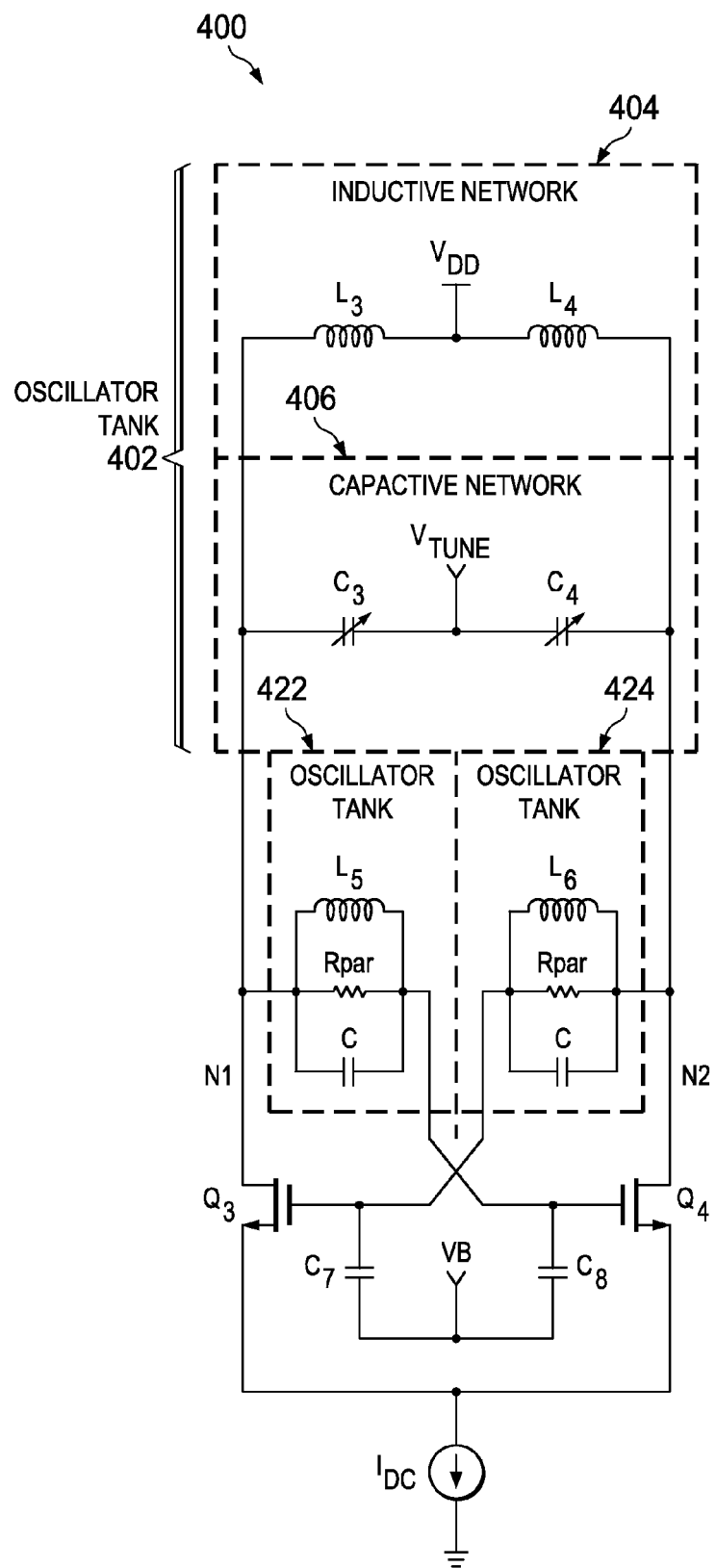
FIG. 3 is an example of circuit diagrams for the VCO of FIG. 2.

Turning to FIG. 3, VCO 400 can be seen in greater detail. As with the VCO 100 of FIG. 1, the VCO 400 is generally comprised of an oscillator tank 402 and a pair of cross-coupled FETs $Q_3$ and $Q_4$ (which operate as transconductance amplifiers). One difference between VCO 100 and VCO 400 is the use of two additional tanks 422 and 424, which are discussed in further detail below. Additionally, the oscillator tank 402 can be subdivided into several components: an inductive network 404 and the capacitive network 406.

The inductive network 404 is generally comprised of a single inductive branch. This inductive branch includes two inductors $L_3$ and $L_4$ (which preferably have the same value) coupled in series to one another between nodes $N_1$ and $N_2$. An input voltage $V_{DD}$ is also provided to the node between the inductors $L_3$ and $L_4$ to generally provide additional power to the VCO 400. Alternatively, the two inductors $L_3$ and $L_4$ can be replaced with a signal inductor with the input voltage being input into a center tap.

The capacitive network 406 is generally comprised of several fixed capacitance branches and a variable capacitance branch; however, for the sake of simplicity as shown in FIG. 3, the capacitive network 406 can be represented two capacitors $C_3$ and $C_4$ (which are preferably variable capacitors). In this configuration, capacitors $C_3$ and $C_4$ are coupled in series with one another between nodes $N_1$ and $N_2$ with a variable voltage $V_{TUNE}$ being received at the node between the capacitors $C_3$ and $C_4$, which allows for adjustment of the impedance of the oscillator tank 402 so as to adjust the frequency of the VCO 400.

Coupled the oscillator tank 402 at nodes $N_1$ and $N_2$ are FETs $Q_3$ and $Q_4$ at their respective drains. Preferably, each of these FETs $Q_3$ and $Q_4$ is an NMOS FET. Each of FETs $Q_3$ and $Q_4$ is cross-coupled to nodes $N_2$ and $N_1$ at its respective gate with oscillator tanks 422 and 424 interposed therebetween, and each of FETs $Q_3$ and $Q_4$ is coupled to current source $I_{DC}$ at its respective source. As can be seen in FIG. 3, oscillator tanks 422 and 424 are generally comprised of inductors $L_5$ and $L_6$ (respectively) and capacitors $C_5$ and $C_6$ (respectively). Preferably, the values of inductors $L_5$ and $L_6$ are the same while the values of capacitors $C_5$ and $C_6$ are also preferably the same. Additionally, capacitors $C_7$ and $C_8$ are coupled in series between the gates of transistors $Q_3$ and $Q_4$ with voltage VB (which is preferably input voltage $V_{DD}$ or ground) applied to the node between capacitors $C_7$ and $C_8$. There is also a parasitic resistance $R_{PAR}$ within each oscillator tank 422 and 424, as shown in FIG. 3. Collectively, each of the oscillator tanks 422 and 424 (along with capacitors $C_8$ and $C_7$, respectively) operate as gain elements with a gain K.

By implementing these oscillator tanks 422 and 424, the drain noise of each FET $Q_3$ and $Q_4$ can be reduced by 1/K, where K is the gain of oscillator tanks 422 and 424. This results in the following equivalent output current noise $\overline{i^2}$:

$$\overline{i^2} = \frac{4kT}{R_P} + 4kT\gamma \frac{1}{KR_P} = \frac{4kT}{R_P}\left(1 + \frac{\gamma}{K}\right), \quad (4)$$

and a phase noise of:

$$PN = \frac{4kT\left(1 + \frac{\gamma}{K}\right)R_P}{2V_{OUT}^2}\left(\frac{\omega_0}{2Q_0\Delta\omega_0}\right)^2. \quad (5)$$

Thus, because the drain noise is usually the dominant noise source in the overall output noise, the reduction in the drain noise can decrease the phase noise directly.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
a voltage source;
a first node;
a second node;
a first oscillator tank including:
an inductive network that is coupled to the voltage source, the first node, and the second node; and
a capacitive network that is coupled to the first node and the second node;
a first transistor having a first passive electrode, a second passive electrode, and a control electrode, wherein the first passive electrode of the first transistor is directly coupled to the first node;
a second oscillator tank that is coupled between the second node and the control electrode of the first transistor;
a second transistor having a first passive electrode, a second passive electrode, and a control electrode, wherein the first passive electrode of the second transistor is directly coupled to the second node; and
a third oscillator tank that is coupled between the first node and the control electrode of the second transistor.

2. The apparatus of claim 1, wherein each of the second and third oscillator tanks further comprise:
an inductor; and
a first capacitor coupled in parallel to the inductor; and
a second capacitor that is coupled to the inductor and the first capacitor.

3. The apparatus of claim 1, wherein the inductive network further comprises:
a first inductor having a first and a second terminal, wherein the first terminal of the first inductor is coupled to the first node, and wherein the second terminal of the first inductor is coupled to the voltage source; and
a second inductor having a first and a second terminal, wherein the first terminal of the second inductor is coupled to the second node, and wherein the second terminal of the second inductor is coupled to the voltage source.

4. The apparatus of claim 1, wherein the capacitive network further comprises:
a first variable capacitor that is coupled to the first node and a third node;
a second variable capacitor that is coupled to the second node and the third node, wherein a tuning voltage is applied to the third node.

5. The apparatus of claim 1, wherein the first and second transistors further comprise first and second NMOS transistors.

6. An apparatus comprising:
a phase/frequency detector (PFD) that receives a reference signal;
a charge pump that is coupled to the PFD;
a filter that is coupled to the charge pump;
a voltage controlled oscillator (VCO) that is coupled to the filter and that generates
an output signal, the VCO including:
a voltage source;
a first node;
a second node;
a first oscillator tank including:
an inductive network that is coupled to the voltage source, the first node, and the second node; and
a capacitive network that is coupled to the first node and the second node;
a first transistor having a first passive electrode, a second passive electrode, and a control electrode, wherein the first passive electrode of the first transistor is directly coupled to the first node;
a second oscillator tank that is coupled between the second node and the control electrode of the first transistor;
a second transistor having a first passive electrode, a second passive electrode, and a control electrode, wherein the first passive electrode of the second transistor is directly coupled to the second node; and
a third oscillator tank that is coupled between the first node and the control electrode of the second transistor; and
a feedback circuit that is coupled to the VCO and to the PFD.

7. The apparatus of claim 6, wherein the inductive network further comprises:
a first inductor having a first and a second terminal, wherein the first terminal of the first inductor is coupled to the first node, and wherein the second terminal of the first inductor is coupled to the voltage source; and
a second inductor having a first and a second terminal, wherein the first terminal of the second inductor is coupled to the second node, and wherein the second terminal of the second inductor is coupled to the voltage source.

8. The apparatus of claim 6, wherein the capacitive network further comprises:
- a first variable capacitor that is coupled to the first node and a third node;
- a second variable capacitor that is coupled to the second node and the third node, wherein a tuning voltage is applied to the third node.

9. The apparatus of claim 6, wherein each of the second and third oscillator tanks further comprise:
- an inductor; and
- a first capacitor coupled in parallel to the inductor; and
- a second capacitor that is coupled to the inductor and the first capacitor.

10. The apparatus of claim 6, wherein the feedback circuit further comprises:
- a prescaler that is coupled to the VCO; and
- a divider that is coupled between the prescaler and the PFD.

11. The apparatus of claim 6, wherein the first and second transistors further comprise first and second NMOS transistors.

12. An apparatus comprising:
- a voltage source;
- a first node;
- a second node;
- a first oscillator tank having:
  - a first inductor having a first and a second terminal, wherein the first terminal of the first inductor is coupled to the first node, and wherein the second terminal of the second inductor is coupled to the voltage source; and
  - a second inductor having a first and a second terminal, wherein the first terminal of the second inductor is coupled to the second node, and wherein the second terminal of the second inductor is coupled to the voltage source; and
- a capacitive network that is coupled to the first node and the second node;
- a first NMOS transistor that is coupled to the first node at its drain;
- a second NMOS transistor that is coupled to the second node;
- a current source that is coupled to the sources of each of the first and second NMOS transistors;
- a second oscillator tank having:
  - a third inductor that is coupled to the second node and to the gate of the first NMOS transistor;
  - a first capacitor that is coupled to the second node and to the gate of the first NMOS transistors; and
  - a second capacitor that is coupled to the gate of the first NMOS transistor and that receives a generally constant voltage; and
- a third oscillator tank having:
  - a fourth inductor that is coupled to the second node and to the gate of the second NMOS transistor;
  - a third capacitor that is coupled to the second node and to the gate of the second NMOS transistors; and
  - a fourth capacitor that is coupled to the coupled to the gate of the second NMOS transistor and that receives the generally constant voltage.

13. The apparatus of claim 12, wherein the capacitive network further comprises:
- a first variable capacitor that is coupled to the first node and a third node;
- a second variable capacitor that is coupled to the second node and the third node, wherein a tuning voltage is applied to the third node.

14. The apparatus of 12, wherein the second and fourth capacitors are each coupled to the voltage source so as to receive the generally constant voltage.

* * * * *